(12) United States Patent
Christensen (10) Patent No.: US 6,696,885 B2
(45) Date of Patent: Feb. 24, 2004

(54) POLYPHASE FILTERS IN SILICON INTEGRATED CIRCUIT TECHNOLOGY

(75) Inventor: Kaare Christensen, Copenhagen (DK)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/822,493

(22) Filed: Apr. 2, 2001

(65) Prior Publication Data

US 2001/0038323 A1 Nov. 8, 2001

(30) Foreign Application Priority Data

Apr. 4, 2000 (GB) .............................................. 0008292

(51) Int. Cl.[7] ................................................ H03K 5/00
(52) U.S. Cl. ........................ 327/552; 333/167; 333/172
(58) Field of Search ................................. 327/552, 553, 327/555, 556, 557, 558, 559; 333/167, 172

(56) References Cited

U.S. PATENT DOCUMENTS

| 4,843,515 A | * | 6/1989 | Richman ...................... 361/58 |
| 4,914,408 A | * | 4/1990 | Voorman ...................... 333/167 |
| 5,128,638 A | * | 7/1992 | Staudinger et al. .......... 333/109 |
| 5,736,840 A | * | 4/1998 | Otaka et al. ................. 323/217 |
| 6,278,870 B1 | * | 8/2001 | Davie et al. ................. 455/302 |

FOREIGN PATENT DOCUMENTS

| EP | 0608815 | 8/1994 |
| EP | 0661805 | 7/1995 |
| FR | 2670975 | 6/1992 |
| WO | 97/20388 | 6/1997 |

OTHER PUBLICATIONS

Green, R. et al: "High Performance Direct Conversion", Electronics World and Wireless World, Reed Business Publishing, Sutton, Surrey, GB, vol. 102, No. 1718, 1996, pp. 18–22, XP000552237, ISSN: 0959–8332.

* cited by examiner

*Primary Examiner*—Dinh T. Le
(74) *Attorney, Agent, or Firm*—Antonelli, Terry, Stout & Kraus, LLP (57) ABSTRACT

An IQ generator is integrated into an IC for generating IQ output signal. The IQ generator includes a signal generator providing input with two identical signals opposed in phase, a filter comprises a plurality capacitances and inductances, and output providing the I and Q signals. The capacitances and inductances of the filter are integrated into said integrated circuit.

7 Claims, 5 Drawing Sheets

POLYPHASE FILTERS IN SILICON INTEGRATED CIRCUIT TECHNOLOGY

BACKGROUND OF THE INVENTION

1. Field of the Invention

The invention relates a novel circuit for generating I-Q-signals, suitable for implementation in an Integrated Circuit (IC).

2. Description of the Prior Art

During the past decades electronics have experienced nothing less than a revolution due to the evolution of low cost silicon integrated circuits. Digital circuits have improved so much due to the continuous technology scaling that more and more signal processing is being moved from the analog to the digital domain. Also much of the remaining analog circuitry is being integrated in silicon Integrated Circuits (ICs) instead of being realized as discrete circuits. This development is driven by the possibility of achieving in ICs high density, low cost and in some cases low power. However inductors have been incompatible with silicon IC technology at the frequencies of interest and the functionality of these components has been replaced by active circuits like OPAMPS, transconductors and gyrators. The impact of these developments has been that inductors slowly and almost unnoticed have disappeared from the electronics engineering within many technical fields.

However up to now, phase-shifting circuits have been implemented using resistors and capacitors, mainly because coils have been considered impractical. Modern technology has opened up the possibility of integrating coils in Integrated Circuits; thus making coil based solutions interesting.

Right now two things are happening that change the situation and both are related to the evolution of the silicon IC technology. The first change is that the cheap silicon transistors—both bipolar and CMOS—are now so fast that radio frequency circuits in the lower GHz range can be made. This has lead to an explosion in the amount of consumer electronics produced and sold in this area. Typical products are cellular phones, pagers, positioning systems, digital television, Internet products, local area networks etc. Many of these electronic circuits can greatly benefit from the use of inductors and transformers for impedance matching, for achieving low noise, to compensate for parasitic capacitances, to get very good linearity and to enable the possibility of having signal swings above the supply. The second change is that the increased transistor speed has moved the focus of the process development to the reduction of the RC delays associated with the IC interconnect. The result is that more and thicker metal layers with lower resistivity are placed further away from the lossy substrate. The impact of this trend is that inductors usable in the lower GHz range can now be integrated. The quality factor is very low—typically not more than 5—but within the next decade inductors with Q-values of 35 will be available thanks to the continuous technology scaling.

The implications of these changes are that the neglected inductors and transformers, to some extend, will find their way back into the electronics engineering curricula. It also means that many integrated circuit designers who have simply never been taught how to design and use inductors and transformers will overlook valuable circuit solutions. Furthermore there is a whole range of new discoveries to made because integrated circuits have very different properties than the discrete circuits have. Especially the balanced topology, which is problematic in discrete solutions due to higher component count and high relative component tolerances, is much better suited in integrated circuits.

One example of an area that maybe has not be fully understood and investigated is circuits like the cross coupled allpass filter structure that depend on three properties; A) receiving a well balanced signal at the input, B) having well matched components and C) having inductors or transformers as available components. The properties A) and B) have been almost impossible to fulfil prior to the IC era and until now C) has not been compatible with silicon IC technology. Therefore it is only now that all three properties are practically feasible in the same technology.

SUMMARY OF THE INVENTION

According to a first aspect of the invention there is provided a polyphase filter for generating an IQ output based upon an input, the filter being included in an Integrated Circuit (IC), and comprises capacitances and inductances, and the capacitances and inductances are integrated into the integrated circuit. Hereby there is provided a LC structure for phase manipulation of balanced signals in state-of-the-art silicon integrated circuit technology. The main benefit of the circuit according to the invention is very low losses compared to the standard phase-shifting circuit using resistors and capacitors. Furthermore the capacitances and the inductances are integrated in the same IC and the circuit in which the filter is used. This increases the integration level of the overall circuit. Until now it has not been possible to use LC components for polyphase filters because the discrete components (especially the inductances) could not be provided with a sufficient precision. However the inventor provided a design guide for inductors in IC's. This design guide may be used for calculating a specific inductor geometry in order to obtain certain impedance. This design guide is able to provide a sufficient precision for the present purpose.

According to a second aspect of the invention there is provided an IQ generator integrated into an integrated circuit for generating IQ output signal. This generator includes a signal generator providing input with two identical signals opposed in phase, a filter comprises a plurality capacitances and inductances, the capacitances and inductances are integrated into the integrated circuit, and output providing the I and Q signals.

According to a third aspect of the invention a polyphase filter is used in an LC IQ generator integrated into an integrated circuit for generating IQ output signal based upon an input from a signal generator, the filter comprises a plurality capacitances and inductances, and the capacitances and inductances are integrated into the integrated circuit.

According to a fourth aspect of the invention a polyphase filter is used in an IQ generator with transformers, the IQ generator is integrated into an integrated circuit for generating an IQ output signal from the transformers based upon an input from a signal generator, the filter comprises a plurality capacitances and inductances, and the capacitances and inductances are integrated into the integrated circuit.

Furthermore the invention is related to a broad band phase shift circuit that will become very useful is direct conversion receivers. The applicant in the pending application GB 9709464.3 describes a direct conversion concept. The invention has another advantage because it is broad banded so it may work in a plurality of channels and even in more than one frequency band.

The invention may be used for up conversion as well as for down conversion—both in a receiver and a transmitter.

For a better understanding of the present invention and to understand how the same may be brought into effect, reference will now be made by way of example only to the accompanying drawings in which:

DETAILED DESCRIPTION OF THE PREFERRED EMBODIMENTS OF THE INVENTION

The invention will be described in the following with reference to preferred embodiments of polyphase filters implemented in integrated Circuits for different applications.

In RF ICs quadrature signals find many different applications. Quadrature signals are four single tone or narrow banded signals with the same magnitude and frequency but with phases separated by 90 degrees. For comparison, balanced signals can be viewed as two signals with same magnitude and with phases separated by 180 degrees.

LC Polyphase Networks

The RC polyphase filter problems associated with resistors, namely the high losses, noise, temperature variation and high absolute tolerances lead to the desire of investigating the possibility of exploiting the use of on-chip inductors in this type of circuits.

In the past on-chip inductors have not been used due to very poor quality factors (less than two). Today on-chip inductors can be made with Q-values of 5–8 and during the next couple of years this will rise to the order of 20–30. This development is caused by three factors: A) The huge digital industry's need for more interconnections between logic gates has resulted in an ever-growing number of metal layers. Today 6 layers are common and 10 layers are expected within the next 5 years. This has the effect that more and more metal can be used for the inductor and at the same time it can be moved further and further away from the lossy substrate. B) Traditionally, the speed of digital circuits was determined by the gate delays, but the transistors are now so fast so the RC delays of the interconnection are becoming dominant. This has the effect that processes are changing from aluminum to copper metallization to reduce R and thicker isolation to reduce C. Both effects are beneficial to inductor design. C) The telecommunication market is now large and profitable enough to influence process development in the direction of adding thick low resistivity layers with the sole purpose of providing good inductors. This section investigates the usability of on-chip inductors in polyphase-filter-like circuits and specifically for IQ generation and image rejection.

In the IC literature very little or nothing is found about this topic. One has to look at the classic network theory and at older literature on discrete RF circuit design. This material briefly covers allpass filters and lumped element 90 degree and 180 degree LC hybrids that can actually be viewed as special cases of allpass filters.

Allpass filters are circuits that realize allpass functions HAP(S), which are transfer functions that have the zeroes placed in the right half plane as mirrors to the poles placed in the left half plane. This can also be expressed as:

$$H_{AP}(S)=D(-s)/D(s),$$

Figure 1:
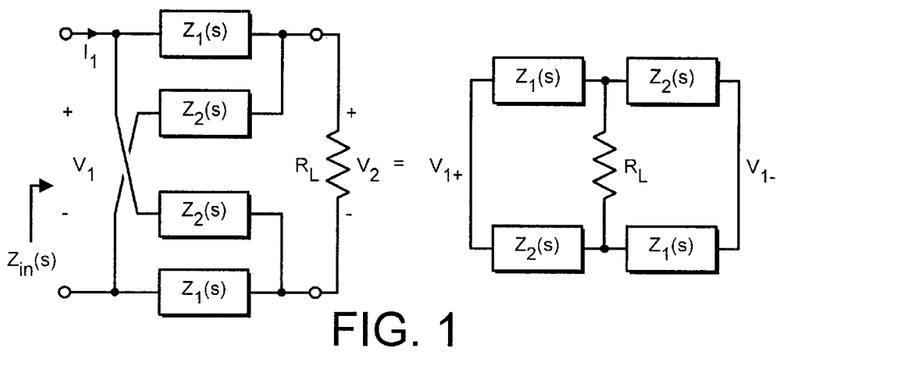
FIG. 1 illustrates-a resistance-reciprocal X-network used as all pass filter according to the invention.

It is known that loss-less LC ladder realizations give alternating poles and zeroes on the imaginary axis and therefore these structures can not be used. One structure that can be used is the resistance-reciprocal X-network that works with balanced signals. As balanced signals are very popular in modern RF IC design, this is the only case treated here even though using transformers can make single ended equivalents. The resistance-reciprocal X-network is shown in FIG. 1 and has the interesting property that the input impedance is equal to the load impedance and therefore a number of these circuits can be cascaded after an ordinary LC filter without changing the amplitude frequency response. Allpass filters are normally used to equalize the group delay of e.g. Chebyshev filters because the phase can be of great importance in some systems—for instance in communication systems that use phase modulation.

In FIG. 1 the resistance-reciprocal X-network is used as allpass filter. The assumption $Z_{in}(s)=V_1/I_1=R_L$ if $R_L/Z_1(s)=Z_2 sir_L$ may be taken. If $Z_1$ and $Z_2$ are realized as passive loss-less LC impedances the magnitude of the transfer function will be the ratio of two complex conjugate numbers i.e. the gain is 1. When $Z_1$ is implemented as a capacitor and $Z_2$ is implemented as an inductor, the circuit is called a first order allpass filter. Higher order Allpass filters can be made by e.g. series coupling an inductor and a capacitor in one branch and parallel coupling another capacitor and another inductor in the other branch.

Figure 6:
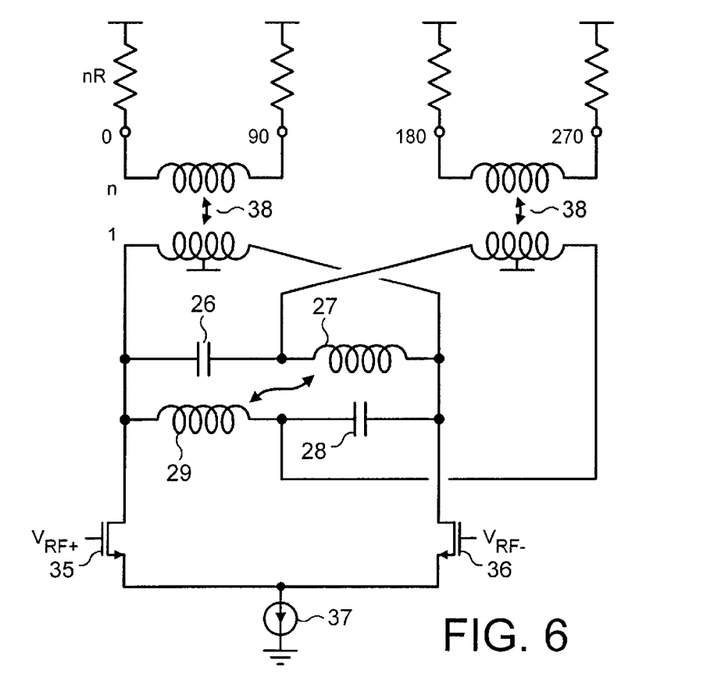
FIG. 6 shows a transformer in which a filter circuit according to the invention is used.

The lumped element 90 degree and 180 degree LC hybrids can actually be viewed as special cases of the first order all pass filter. The 90-degree hybrids are shown in FIG. 6. The 90 degree hybrids suffer from being relatively narrow banded (1–2%) depending on the balance required. Also it is said that it should be possible to integrate the 90 degree hybrid to the left in FIG. 1 on an IC. This has nevertheless not been done or documented so far (at least not in a silicon process). Interestingly enough on an IC neither 90 degree hybrid of FIG. 1 can be made in their pure forms—but a combination of the two can. This is because there will always be some parasitic capacitance to ground and there will always be some coupling between inductors. It is however believed to be true that such hybrids can be made and later this topic is discussed in more detail.

From the discussion above it is seen that these LC structures may be useful for poly-phase filters. The allpass filters indicate that phase filtering or phase manipulation is possible without affecting magnitude. The 90-degree hybrids shown in FIG. 1 further indicate that 90 degree phase shifting is possible without affecting magnitude.

Figure 2:
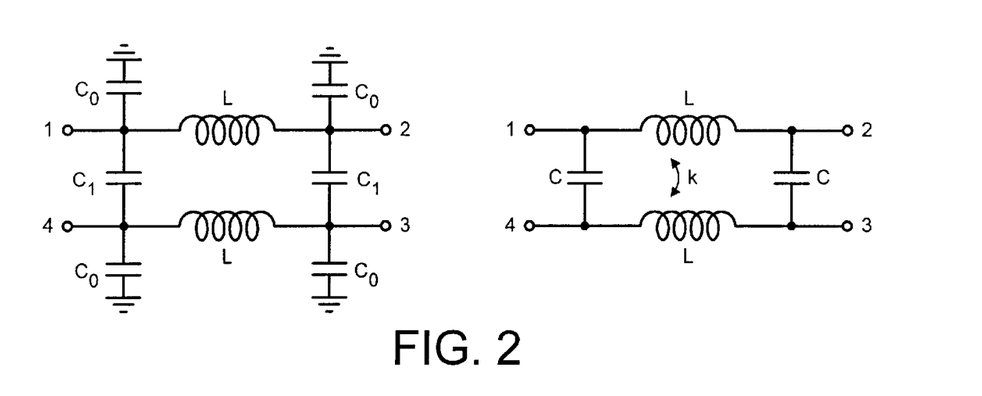
FIG. 2 shows two 90-degree lumped LC hybrid—with capacitance to ground (left) and with transformer (right).

It has been observed that the LC structures can be used to generate a balanced Q signal (Quadrature=shifted 90 degrees) and use the original signal as a balanced I signal (In phase). Also this means that much less thermal noise is added (ideally zero) and the signal is not attenuated as it would have been for the corresponding RC case (having 6 dB attenuation). Due to the fact that the parasitics can be handled in a proper way, a perfect quadrature signal generator may be obtained according to the invention. This is a structure is very similar to the two 90 degree hybrids shown in FIG. 2.

Figure 8:
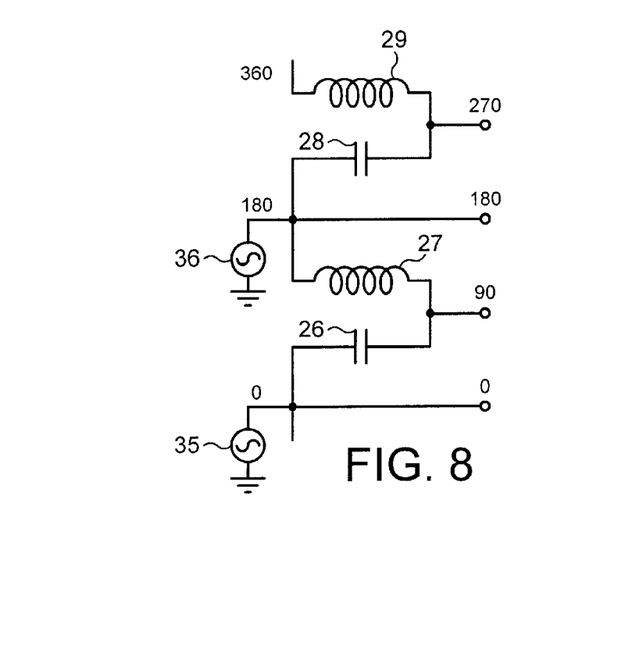
FIG. 8 shows a polyphase filter for IQ generation according to the invention.

A one stage LC polyphase filter is shown in FIG. 8, and generates (in the ideal case) four quadrature signals that need to be resistively loaded, but also provides common mode rejection for the 90 and 270 degree outputs. The circuit includes two identical signal sources 35 and 36 opposed in phase, two identical capacitors 26 and 28, two identical inductors 27 and 29.

Figure 9:
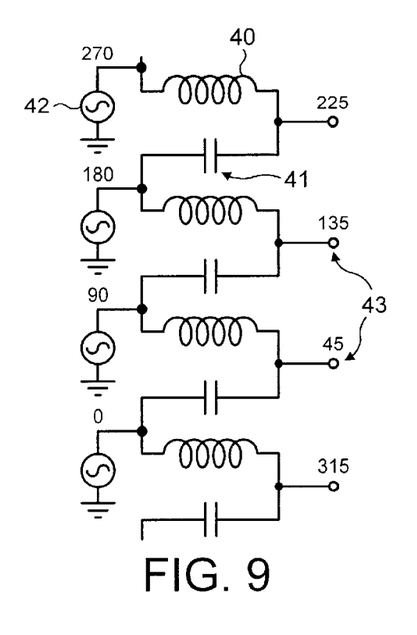
FIG. 9 shows a polyphase filter for common mode generation according to the invention.

Another one stage LC polyphase filter is shown in FIG. 9, and passes all the quadrature signals but rejects the common mode signals i.e. the part of all four input signals that is common. The circuit includes four identical signal sources 42 shifted 90 degrees in phase relatively to each other (e.g. the output from the circuit shown in FIG. 8), four identical capacitors 41, four identical inductors 40, and four outputs 43 providing 45 degrees, 135 degrees, 225 degrees and 315 degrees shift relatively to the 0 degree input signal.

CMOS LC IQ Generator

Figure 3:
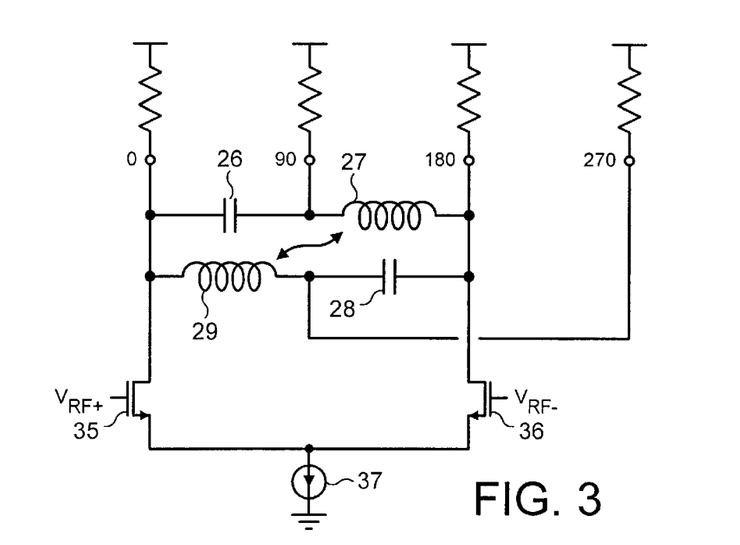
FIG. 3 shows a preferred embodiment of a filter circuit according to the invention used in a LC IQ generator integrated in silicon IC process.

The preferred embodiment according to the invention will be discussed in the following. The preferred embodiment of a design of a LC IQ generator that can be integrated in a silicon IC process is shown in FIG. 3. The different choices such as load impedances are explained, a sensitivity analysis presented and different measures are explained to tune and calibrate the circuit to operate well at the desired center frequency of e.g. 2 GHz.

The preferred embodiment of the LC IQ generator includes a CMOS Differential Pair with Quadrature Outputs. Traditionally, in IC technology the desired signal usually comes from a transistor that fundamentally works as a transconductor. Therefore the signal is a current that somehow needs to be loaded to be transformed into a voltage signal. The LC IQ generator according to the preferred embodiment of the invention is constructed as a differential pair with an RLC polyphase load and thus creates quadrature outputs. The circuit is shown in FIG. 3 without parasitics.

The circuit shown in FIG. 3 includes a current generator 37, two identical signal sources 35 and 36 opposed in phase, two identical capacitors 26 and 28, two identical inductors 27 and 29.

It should be noted that this circuit could also be made with bipolar transistors but for this treatment CMOS has been chosen. The transistors themselves add a few non-idealities to the parasitics mentioned in the previous section. The first is that the transistors have a finite output impedance which results in an equivalent R DS resistance placed in $V_{RF+}$ parallel with the input load resistors in the small signal diagram. This is not a problem for two reasons. The cascading technique can increase the effective $R_{DS}$ to well above 1 kΩ and if this is not enough the load imbalance can be adjusted for by changing L and C.

Figure 4:
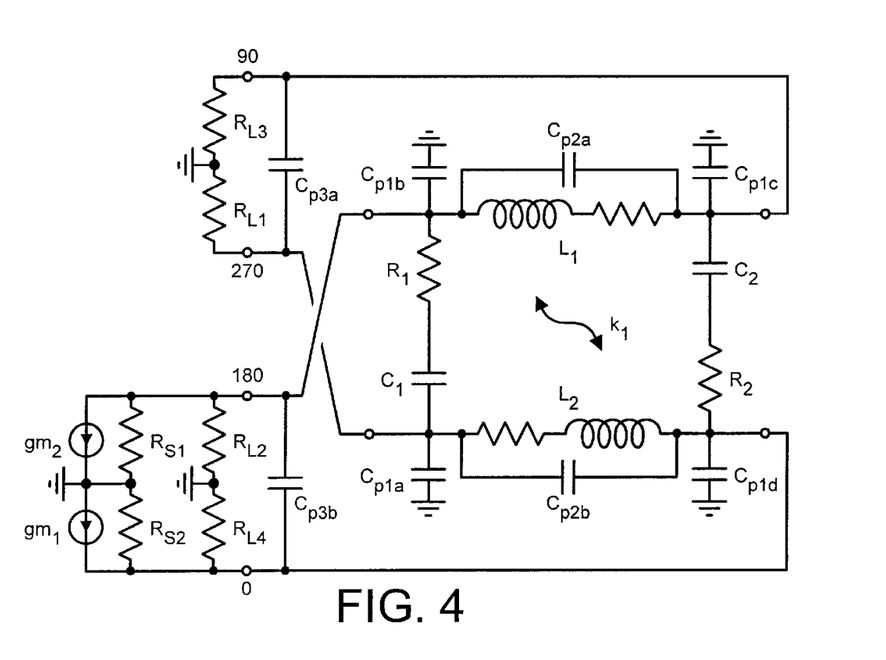
FIG. 4 shows the signal diagram of the circuit shown in FIG. 3 with parasitics as presented so far and representing the finite output impedance of the transistor pair.

Apart from this non-ideality, the transistor stage will inevitably introduce some parasitic capacitance to ground which is not present at the output. To some extend this capacitance can be matched by placing an approximately equal sized capacitance at the output and thus the problem is covered by the $C_{par1}/C_{par3}$ treatment of the previous section. FIG. 4 shows the small signal diagram of the circuit from FIG. 3 with parasitics as presented so far and $R_S$ representing the finite output impedance of the transistor pair.

High output impedance is desired if a high voltage gain or if low power consumption is needed. However we know that $R_{load}$ and C are inversely proportional. This implies that a high $R_{load}$ gives a low C and therefore the circuit becomes much more sensitive to the parasitic capacitances. The value of L is also affected by the size of $R_{load}$ but when the two inductors are coupled with a coupling coefficient of 0.8 the inductance values are not problematic at e.g. 2 GHz. Therefore the main trade-off in the choice of load impedance is between $R_{load}$ and C. It is desirable to have a C of at least ten times the parasitic capacitances which are in the order of one tenth of a pico-farad (pF) i.e. it would be desirable to have a C in the order of one pF. For the four load resistances it is desirable to have values above say a 100 kΩ or perhaps above 200 kΩ. At a voltage gain of 1 (actually it is a gain of 6 dB because there are four outputs) the needed gm of the transistors is in the order of 10 mS which is indeed realizable at a reasonable power consumption.

Figure 5:
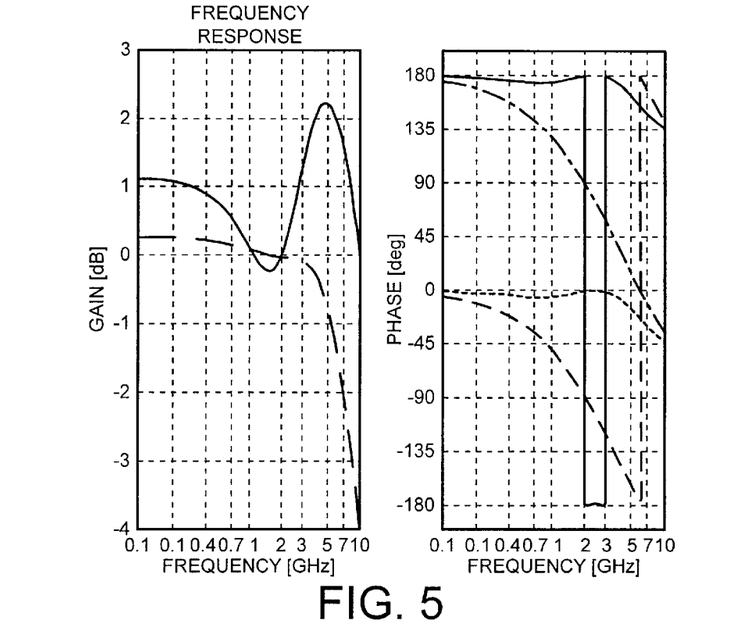
FIG. 5 shows a frequency response of the optimized circuit with load resistances of 60Ω according to the embodiment shown in FIGS. 3 and 4.

The desired values of $R_{load}$ and C can not be fulfilled simultaneously at 2 GHz. However a reasonable compromise can be made by choosing the load resistances ($R_{L1-RL4}$) to be 60Ω. This corresponds to a capacitance ($C_1$ & $C_2$) of 0.63 pF and a transistor transconductance (gm1 & gm2) of 37.4 mS for a voltage gain of 6 dB. FIG. 5 shows a frequency response of the optimized circuit with load resistances of 60Ω.

Though acceptable, these values suggest that this circuit may work better at a lower frequency for instance 1 GHz.

CMOS LC IQ Transformer

Another option not mentioned so far is to use transformers as shown in FIG. 6 to up-convert the impedance levels in order to get a higher voltage gain. This would also give the added benefit of easy biasing of the circuit because the inductors in the transformer can be center tapped. The added parasitic inductance/capacitance (caused by the imperfect transformer coupling and capacitance to ground) may cause some problems. These problems are in the order of the other parasitics and it should be possible to deal with them. For time and simplicity reasons, this option is not be treated in greater detail herein.

Finally importantly, the resistive loads do not have to be resistors as shown in FIG. 3. They can also be succeeding amplifier stages with resistive input impedances such as shunt-series amplifiers or common gate amplifiers. Similar to the circuit shown in FIG. 3, the circuit of FIG. 6 includes a current generator 37, two identical signal sources 35 and 36 opposed in phase, two identical capacitors 26 and 28, two identical inductors 27 and 29. Furthermore the circuit includes two transformers 38.

A sensitivity analysis is interesting for several reasons. It identifies components that are more likely to introduce phase and amplitude errors and verifies that the effects of the parasitic components have been minimized. Also, a sensitivity anlaysis suggests which components are more relevant for tuning or calibration. The sensitivity analysis has been done for the circuit in FIG. 4 and the sensitivity of each component alone was found for each of the four output signals. The two outputs with 0-degree and 180-degree phase have similar sensitivities for symmetry reasons and like-wise for the 90 and 270 degree phase. Therefore, it is sufficient to consider one of each e.g. the output with 0 degrees phase and the output with 90-degrees phase. The magnitude sensitivities of the dominating components at the output with 0-degrees phase are summarized in Table 1 and the corresponding phase sensitivities are summarized in Table 2.

and therefore it could be interesting to tune $C_1$. One more point worth noting is that the sum of the sensitivities of parasitic capacitances $C_{p3a}$ and $C_{p3b}$ is zero and therefore the phase is relatively insensitive to these capacitances.

When looking at the magnitude and phase of the 90-degree output, higher sensitivities are expected since the LC polyphase network generates this output. This is exactly

TABLE 1

Magnitude sensitivity of IQ generator. Change in % for a 1% component change.

| | Component | | | | | | | | | |
|---|---|---|---|---|---|---|---|---|---|---|
| | RL4 | L2 | RL1 | k1 | C2 | C1 | RL3 | RL2 | RS2 | CP2B |
| Magnitude (0) | 0.48 | 0.33 | −0.26 | 0.26 | −0.21 | −0.20 | −0.19 | −0.03 | −0.03 | 0.02 |

TABLE 2

Phase sensitivity in IQ generator. Change in deg. for a 1% component change.

| | Component | | | | | | | | | |
|---|---|---|---|---|---|---|---|---|---|---|
| | RL1 | RL3 | L2 | L1 | C1 | CP1D | k1 | CP3A | CP3B | R2 |
| Phase (0) | −0.12 | 0.12 | 0.06 | 0.06 | 0.04 | −0.02 | 0.02 | 0.02 | −0.02 | 0.01 |

From these numbers is clear that both magnitude and phase is mainly dominated by $R_L$, C and L as expected and desired. The magnitude is most sensitive to variations in $R_{L4}$, which is obvious when considering the schematic in FIG. 4. What is more interesting is to note that the sum of the variations of all the load resistances ($R_{L1}$, $R_{L2}$, $R_{L3}$ and $R_{L4}$) is zero and therefore the circuit is relatively insensitive to process and temperature variations at this point. Resistance mismatch errors however must still be kept under control. The second most important parameter is $L_2$, which has less process variation and therefore is not as critical can be compensated for to some extent by varying the capacitances $C_1$ and $C_2$.

For the phase $R_{L1}$ and $R_{L3}$ are the most dominating contributors. However, since their sensitivities are equal and have opposite signs, we see the same characteristic of their magnitude and the phase is relatively insensitive to resistor process and temperature variations. $L_2$, $L_1$ and $k_1$ are also important but they have small process variations and therefore they may not be the worst source of errors. The phase is less sensitive to $C_1$ variations. However, $C_1$ can have large process variations so this may be the worst error contributor what is in Table 3 and Table 4 that summarize the magnitude and phase sensitivities of the 90-degree output of the circuit in FIG. 4. The sensitivities have increased approximately by a factor of two. For the magnitude it is seen that the output is strongly sensitive to the load resistances and that the output no longer has opposite signs. This means that the 90-degree and 270-degree outputs are sensitive to resistor process and temperature variations. This also indicates that it could be desirable to have the possibility of calibrating the load resistances. Apart from this, the sum of the sensitivities of the inductances is zero and thus the magnitude is relatively insensitive to inductance variations.

For the phase of the 90-degree output, it is seen that $R_{L2}$ and $R_{L4}$ have opposite signs and therefore make the phase insensitive to variations in the load resistances. Apart from this, it is seen that the phase is relatively sensitive to variations in $L_1$ and $k_1$ which is expected and relatively sensitive to variations in all the capacitances which is also expected. The conclusion is therefore that for controlling the phase of the 90-degree and 270-degree outputs it is desirable if the capacitances could be calibrated.

TABLE 3

Magnitude sensitivity of IQ generator. Change in % for a 1% component change.

| | Component | | | | | | | | | |
|---|---|---|---|---|---|---|---|---|---|---|
| | RL3 | RL2 | RL4 | L2 | L1 | C1 | k1 | RL1 | R2 | CP1D |
| Magnitude (90) | 0.49 | 0.26 | 0.19 | −0.11 | 0.11 | −0.07 | 0.03 | −0.02 | −0.02 | −0.02 |

TABLE 4

Phase sensitivity in IQ generator. Change in deg. for a 1% component change.

| | Component | | | | | | | | | |
|---|---|---|---|---|---|---|---|---|---|---|
| | L1 | k1 | RL2 | RL4 | C2 | C1 | CP1C | CP3A | CP3B | CP2A |
| Phase (90) | −0.19 | −0.15 | 0.13 | −0.13 | −0.13 | −0.12 | −0.02 | −0.02 | −0.02 | −0.01 |

It is seen that the circuit in FIG. 3 and FIG. 4 can produce quadrature outputs with magnitude errors less than 10–20% and phase errors less than 5–10 degrees . The magnitude errors are mainly caused by load resistance process and temperature variations and the phase errors are mainly caused by process variations in the capacitances.

For some less critical applications this may be sufficient to provide the desired functionality but for more critical applications it is not. Instead, some kind of calibration of the load resistances should be employed to reduce the magnitude errors and some kind of capacitance calibration should be employed to reduce the phase errors.

Figure 7:
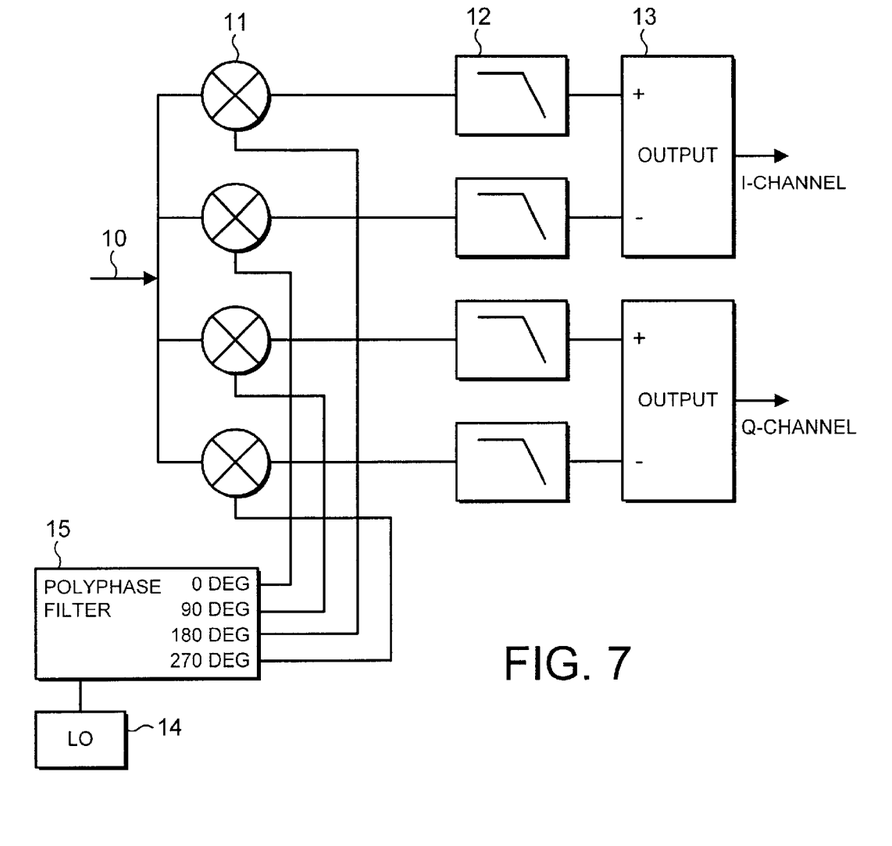
FIG. 7 shows the polyphase filter according to the invention implemented into a direct conversion down conversion mixer.

Calibration or programmability of the load resistance and of two-port capacitances can be done. FIG. 7 shows one example of how, according to the preferred embodiment of the invention, this is done in each case. The load resistance can be calibrated or adjusted by coupling in additional resistances in parallel with the main resistance. By choosing the right values for the added resistors, the load resistance can be controlled directly with a binary signal with e.g. 3–4 bits. Another option is to place a transistor in parallel with the load and change the gate voltage. This enables continuous tuning of the load resistance but it also reduces linearity. Both the capacitance to ground and between the nodes can be calibrated or programmed by changing the values of $C_1$ and $C_2$.

Changing these capacitances can be done digitally by switching in capacitances or continuously by using varicaps. If measures are taken to calibrate both load resistances and capacitances, it should be possible to reduce the aforementioned errors by at least a factor of ten. Such an improvement is sufficient to satisfy the demands of many critical applications and therefore it should be possible to use this RLC quadrature generator in many RF integrated circuits that need either the LO or the RF signal in quadrature. Table 5 summarizes the estimated achievable errors of the RLC quadrature generator according to the preferred embodiment of the invention.

TABLE 5

Estimated achievable gain and phase errors of the RLC quadrature generator.

| | Without $R_L$ and C calibration | With $R_L$ and C calibration |
|---|---|---|
| Gain error | <10–20% | <1–2% |
| Phase error | <5–10 degrees | <0.5–1 degree |

It is well known to generate quadrature signals and to use image rejection in radio receivers. Also typical loads and sources in silicon RF integrated circuits are well known to persons skilled in the art. Besides this, the passive components that can be designed in a silicon process with special attention given to CMOS technology and integrated inductors and transformers.

A general expression for the functionality of polyphase networks can be used to describe exactly how the traditional RC polyphase structures work when used for quadrature generation as well as when they are used to provide image rejection. Their parasitics and penalties were described pointing out the problems related to the difficulty of achieving the right RC product and sets the single frequency at which the RC structures work ideally. Apart from this, the main problems related to the RC polyphase filters are the fairly high power losses caused by the resistors: −3 dB per stage when used for image rejection and −6 dB per stage when used for quadrature generation.

Different LC polyphase networks were analyzed to try to identify whether inductors could be used to provide the same functionality without introducing the substantial losses and the associated thermal noise. First allpass filter theory and lumped element LC hybrids were shortly reviewed. Then the general expression for polyphase networks can be used to accurately describe the functionality of the LC polyphase network. It was found that LC polyphase networks practically work in an opposite manner than a RC network and therefore can not be used for image rejection. At a first glimpse it looks as if LC polyphase networks can not be used for quadrature generation either. However LC polyphase network low losses and ability to transform impedances up or down enables generation of quadrature signals but with significantly less loss than the RC networks.

The different parasitics of the LC polyphase network were then described and especially the effect of the poor quality factor of the inductors was analyzed. It turns out the inductor losses introduce gain and phase errors. Symbolic analysis can be found that these losses can be compensated for by introducing similar losses in the capacitors and adjusting L and C slightly. Based on this analysis, a set of expressions can be found that gives the correct component values for a loss compensated quadrature generating LC polyphase network.

Apart from the losses, the parasitic capacitances can be identified and their impact on the LC network functionality can be analyzed using an appropriate analysis program. Some measures were also presented to deal with these parasitics. These measures include reducing L, using tuned balanced outputs and adding extra losses to the circuit. Further the inductive coupling between the two inductors in the quadrature generator was described. At 2 GHz this coupling is desired for several reasons. Most important is that inductive coupling reduces the needed inductance from tens of nano-Henry (nH) to the order of 5 nH and thus saves area and enables the design of inductors with a better quality factor. Also inductive coupling can reduce the parasitic capacitances and improve the matching between the inductors.

The preferred embodiment of the circuit according to the invention has the clear advantage of generating a quadrature signal without attenuating the signal 6 dB as the RC polyphase network does. Actually the LC network can provide a fair amount of power gain because much less power is dissipated than a RC network does and because the transistors provide actual power gain. In the coming years this will become even more true because the inductors are expected to have significantly better quality factors. Also it was noted that the resistive loads do not have to be actual resistors but can also be subsequent amplifier stages with resistive input impedances.

This differential pair can be described and optimized with all relevant parasitics using an appropriate circuit analysis program. It turned out that four 60Ω loads were estimated to be the best trade-off for the given situation and the available components. All component values needed to provide RLC quadrature generation in a 0.25 micron CMOS process can then be found. Further a sensitivity analysis was performed to identify which components are most critical for the functionality and further to identify the components that would be best to calibrate or digitally program. The load resistances are definitely targets for calibration and fortunately this can be done in a fairly straightforward manner. Also important but less significant is the option to tune the capacitances. It can be done but is more difficult and the achievable error reduction is less significant depending on the situation.

As a conclusion of the evaluation it appears fundamentally that the LC polyphase network according to the invention has phase and magnitude errors comparable to the RC case. If the load resistance and the capacitances are calibrated, accurate quadrature generation can be accommodated with good linearity, low noise, low loss and fairly low power consumption. The invention also gives an alternative method of generating quadrature versions of modulated RF signals that, for noise reasons, may be too weak to be passed through an RC polyphase network.

FIG. 7 shows how the polyphase filter according to the invention may be implemented into a down conversion mixer, e.g. as described in GB 9709464.3. This application is hereby incorporated by reference. A Local Oscillator 14 provides a tone signal fed to the polyphase filter 15 according to the invention and this filter 15 outputs four signals at 0 degrees, 90 degrees, 180 degrees and 270 degrees, respectively.

A RF signal is fed to the input 10 for down conversion, and this signal is branched into four branches and fed to four mixers 11. Here the RF signal is mixed with a respective one of the polyphase filter outputs, low pass filtered by means of four filters 12. Finally the 180 and 0 degree signals and the 270 and 90 degree signals are subtracted from each other in order to provide the I and Q signals. By this subtraction the second order inter modulation products are removed as described in the above-mentioned application.

Preferably the capacitor is provided as two metallic plates in the semiconductor structure with a semiconductor layer, e.g. silicon oxide, placed in between for separating the layer. The inductor is provided as a helical winding of the conducting path in the metallic layer. One of the terminals of the inductor is provided outside the ring of the helical windings, while the other is positioned inside this ring and therefor has to be connected via a via (a metallic interconnection between two metallic patterns through the semi-conducting layer in between the two metallic patterns.

Figure 10:
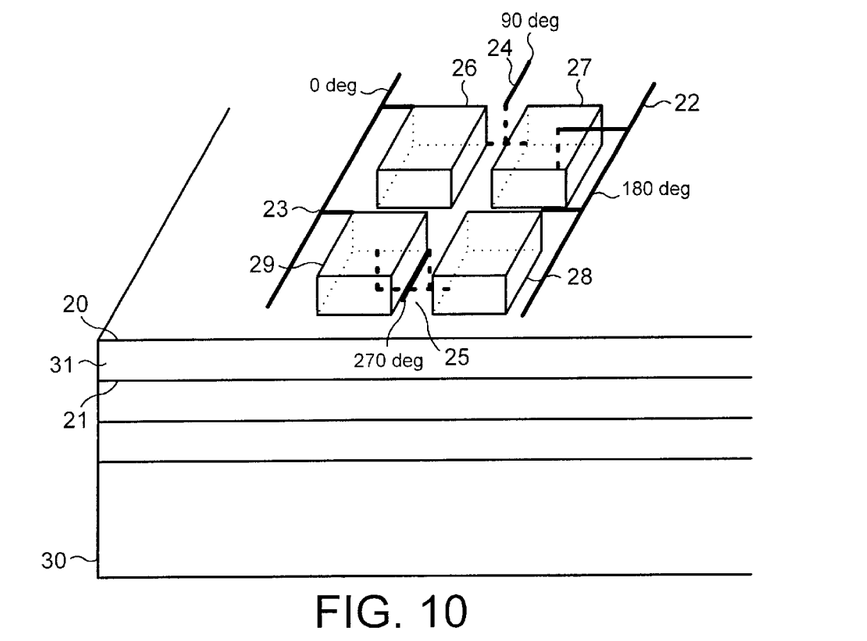
FIG. 10 shows schematically an embodiment for implementing a polyphase filter into an Integrated Circuit according to the invention.

FIG. 10 shows schematically such a structure. The guide for implementing the inductors and capacitor into the Integrated Circuit can be found in "Easy Simulation And Design of On-chip Inductors In Standard CMOS Process." Kåre Theis Christensen and Allan Jørgensen, Center for Integrated Electronics, Technical University of Denmark, 1998 IEEE.

The structure in FIG. 10 includes a die 30 on which several insulating layers has been grown with a metallic pattern in between and with vias connecting the patterns through these insulating layers. The polyphase filter according to the invention is provided by means of two metallic patterns 20 and 21, and an insulating layer 31 separating these two layers 20 and 21. Two metallic paths 23 and 22 receive the Local Oscillator signal in-phase and in opposite phase, respectively, and therefor the 0 degrees and 180 degrees signal will be present on these terminals in the upper metallic pattern 20. The metallic path 23 is connected to an inductor 26 manufactured according to the design guide referred to above. The helical windings are provided in the upper metallic pattern 20, and the end of the winding is via a via connected to a metallic path on the lower metallic pattern 21. Via another via this path is connected to a terminal 25 provided in the upper metallic pattern 20, and the 270 degrees signal is present on this terminal 25. Furthermore this path is connected to a capacitor plate of a capacitor 28 being provided with capacitor plates in both the upper and the lower metallic pattern 20, 21. The upper capacitor plate of the capacitor 28 is connected to the path 22.

The metallic path 23 is furthermore connected to a capacitor plate of a capacitor 26 being provided with capacitor plates in both the upper and the lower metallic pattern 20 and 21. The upper capacitor plate of the capacitor 26 is connected to an inductor 27 manufactured according to the design guide referred to above. The helical windings are provided in the lower metallic pattern 21, and the end of the winding is via a via connected to a metallic path on the upper metallic pattern 20. The path connecting the capacitor 26 and the inductor 27 is via another via connected to a terminal 24 provided in the upper metallic pattern 20, and the 90 degrees signal is present on this terminal 24.

The quality factor Q of the filter according to the invention is preferably higher than 10. It is expected that the Q factor can be raised to higher values—a Q factor in the level of 35 is expected to become realized by means of the invention.

What is claimed is:

1. A polyphase filter for generating I and Q output signals from first and second output nodes comprising:
 a first and a second input for connecting to first and second input signals opposed in phase which are used to produce the I and Q signals;
 the first input being coupled to a first load resistance with the first output node being located between one end of the first load resistance and the first input;
 the second input being coupled to a second load resistance with the second output node being located between one end of the second load resistance and the second input;
 at least one capacitor and at least one inductor coupled together and one end of the at least one inductor being coupled to one of the first and second output nodes and one end of the at least one capacitor being coupled to another end of the first and second output nodes; and wherein
 the capacitors and the inductors are integrated into an integrated circuit.

2. A polyphase filter according to claim 1, wherein:
 the pair of input signals comprises two identical signals opposed in phase.

3. A polyphase filter according to claim 1, wherein:
 the polyphase filter has a quality factor (Q) higher than 10.

4. A polyphase filter according to claim 2, wherein:
 the polyphase filter has a quality factor (Q) higher than 10.

5. An I and Q generator integrated into an integrated circuit for generating I and Q output signals from first and second output nodes, the generator comprising:
 a signal generator providing first and second signals opposed in phase;
 a filter, coupled to the first and second signals opposed in phase, the filter comprising first and second inputs connected respectively to the first and second signals opposed in phase which are used to produce the I and Q signals, the first input being coupled to a first load resistance with the first output node being located between one end of the first load resistance and the first input, the second input being coupled to a second load resistance with the second output node being located between one end of the second load resistance and the second input, at least one capacitor and at least one inductor coupled together and one end of the at least one inductor being coupled to one end of the first and second output nodes and one end of the at least one capacitor being coupled to another of the first and second output nodes; and wherein
 the at least one capacitor and the at least one inductor are integrated into an integrated circuit.

6. An I and Q generator according to claim 5, wherein the filter comprises:

transformers, primaries of the transformers respectively coupled to the two signals opposed in phase, secondaries of the transformers respectively providing the I and Q signals at the respective output nodes with a voltage gain relative to a voltage input respectively to the primaries of the transformers.

7. A polyphase filter for generating I and Q output signals from first and second output nodes comprising:

a first and second input for connection to first and second input signals opposed in phase which are used to produce the I and Q signals;

the first input being coupled to first and second load resistances by a first transformer;

the second input being coupled to third and fourth load resistances by a second transformer;

a first capacitor and a first inductor coupled together with one end of the first inductor being coupled to the primary of the first transformer and another end of the first inductor being coupled to the primary of the second transformer and one end of the first capacitor being coupled to the primary of the first transformer and another end of the first capacitor being coupled to the primary of the second transformer;

a second capacitor and a second inductor coupled together with one end of the second inductor being coupled to the primary of the first transformer with another end of the second conductor being coupled to the primary of the second transformer and one end of the second capacitor being coupled to the primary of the first transformer and another end of the second capacitor being coupled to the primary of the second transformer; and wherein the capacitors and the inductors are integrated into an integrated circuit.

* * * * *